United States Patent [19]
Jacks et al.

[11] Patent Number: 5,740,178
[45] Date of Patent: Apr. 14, 1998

[54] SOFTWARE FOR CONTROLLING A RELIABLE BACKUP MEMORY

[75] Inventors: Steven Anthony Jacks, Villa Park, Ill.; Kevin John McNeley, Succasunna, N.J.

[73] Assignee: Lucent Technologies Inc., Murray Hill, N.J.

[21] Appl. No.: 703,144

[22] Filed: Aug. 29, 1996

[51] Int. Cl.[6] .................................................. G06F 11/00
[52] U.S. Cl. .................................... 371/21.5; 371/25.1
[58] Field of Search ............................ 371/21.5, 25.1, 371/24, 37.1, 37.2, 37.3, 53, 54

[56] References Cited

U.S. PATENT DOCUMENTS 5,146,459  9/1992  Shimizu ................................. 371/21.5
5,181,206  1/1993  Hashiguchi ........................... 371/21.5
5,349,697  9/1994  Pelkonen .............................. 371/21.5

Primary Examiner—Vincent P. Canney

[57] ABSTRACT

An Electrically Erasable Programmable Read Only Memory (EEPROM) provides backup and initialization data for random access memory (RAM) in a control unit. In order to update the EEPROM with new releases of a program and data, the EEPROM is divided into two segments, each with a separately controllable write enable voltage. Advantageously, this allows a new release to be written into one segment of a single EEPROM without erasing the other segment until the newly written segment has been verified. The software for controlling an update of the EEPROM is stored in RAM and the software for controlling an initialization of the RAM from the EEPROM is stored in the EEPROM. Extensive checks are performed before accepting an update of the EEPROM or an initialization of the RAM.

9 Claims, 4 Drawing Sheets

SOFTWARE FOR CONTROLLING A RELIABLE BACKUP MEMORY

RELATED APPLICATIONS

This application is related to D. L. Anderson and S. A. Jacks: "Reliable Backup Memory" and to S. A. Jacks and K. J. McNeley: "Reliable Backup Memory" and to S. A. Jacks and K. J. McNeley: "Backup Memory for Reliable Operation", both of which applications are being filed simultaneously with this application and being assigned to the same assignee as this application.

TECHNICAL FIELD

This invention relates to arrangements for providing software to support a reliable backup memory system for initializing the active memory of the processing system or control system.

PROBLEM

In telecommunication systems, it is frequently necessary to have a standby backup memory for initializing the random access memory (RAM) used for normal operations of the system, and an electrically erasable programmable read only memory (EEPROM) memory is an ideal memory for this purpose since this memory is normally only changed when it is updated. However, it is necessary to have the highly reliable arrangement to update the RAM from the EEPROM since if the RAM is improperly updated, the telecommunication system will fail to function properly. A problem of the prior art is that there is no fully satisfactory arrangement for controlling a reliable update mechanism from a backup memory to an active working memory.

SOLUTION

The above problem is solved and an advance is made over prior art accordance with applicants' invention wherein the EEPROM back up memory stores a program for controlling the update of the RAM; this makes it unnecessary to rely on programs in the RAM to perform the updating function. Further the backup memory contains data which allows that data to be copied into different segments of the RAM, and contains hash sums which, when the RAM has been fully initialized, should reflect the state of initialized RAM. The EEPROM is much more expensive than RAM and is advantageously much smaller in total capacity than RAM; the RAM when used contains a great deal of dynamic data whereas the initialization data in the EEPROM is only required for programs and static data. Thus the RAM is not simply a copy of the contents of a part of the EEPROM but is a copy of blocks of EEPROM scattered in various locations in the RAM. Under these circumstances to insure the memory has been properly copied, the EEPROM stores a series of cyclic redundancy check (CRC) sums reflecting CRC sums generated for a fully initialized RAM. A check of the initialization process can therefore be made by generating these CRC sums over the contents of the initialized RAM and comparing them with the pre-stored CRC sums.

The program for controlling EEPROM updates is first stored in the EEPROM, then written into RAM; the RAM-stored program controls the EEPROM updates.

BRIEF DESCRIPTION OF THE DRAWING

FIG. 3 and 3A are a layout of information stored in one segment of the EEPROM;

FIGS. 4, 4A, 5 and 5A are flow diagrams of programs used to implement applicants' invention.

DETAILED DESCRIPTION

Figure 1:
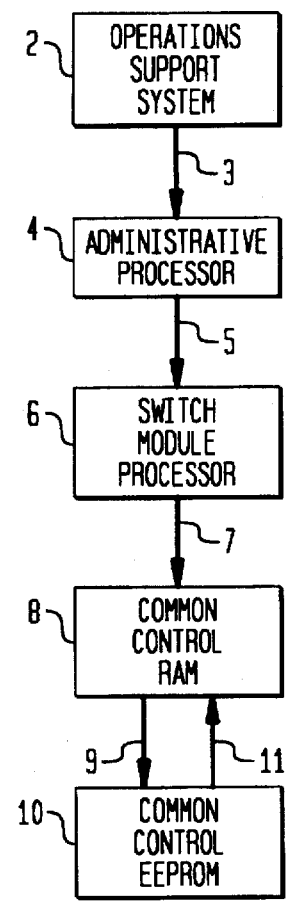
FIG. 1 is an overall diagram showing the flow of data for the exemplary embodiments of applicants' invention.

FIG. 1 is a block diagram illustrating a specific preferred embodiment of which applicants' invention is a critical part. An operations support system 2 transmits data over a link 3 to the administrative processor 4 of a switch (not shown) such as the 5ESS® switch manufactured by Lucent Technologies Inc. In this embodiment, the administrative processor forwards this new data over another link 5 to a Switch Module processor (SMP) 6 which is within a switch module. The switch module includes a DNU (digital networking unit)/ SONET interface controlled by duplicated common controls. One of the common controls has been changed to be in an off-line state in order to have its memory updated. The SMP 6 transmits the initialization data over link 7 to that common control where it is stored in RAM 8. The common control RAM data is then used to initialize the common control EEPROM 10 in a process indicated by arrow 9. The EEPROM is then used to initialize the common control RAM 8 in a process indicated by arrow 11. The processes of arrow 9 and 11 are described in greater detail within FIGS. 4 and 5. After this action has been completed, the off-line common control is changed to be in an on-line state and the other of the duplicated common control units is placed off-line to have its EEPROM and RAM initialized.

Figure 2:
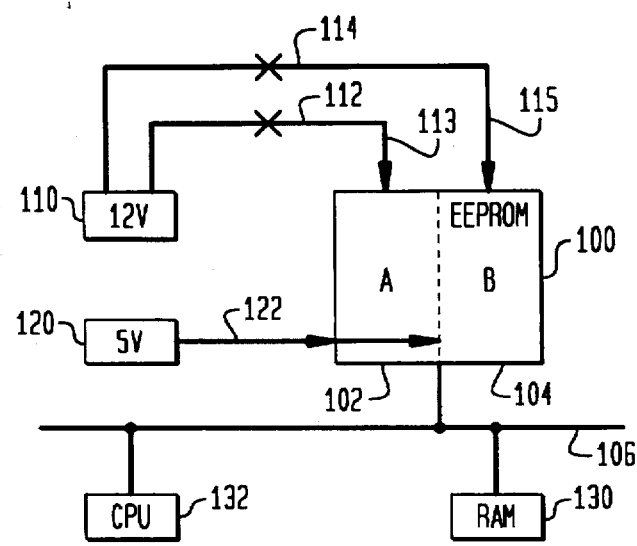
FIG. 2 is a block diagram of the hardware of applicants' embodiment.

FIG. 2 is a block diagram illustrating the relationship of the RAM, the EEPROM and a central processing unit (CPU) of the common control. An EEPROM 100, RAM 130 and CPU 132 are all connected to bus 106. CPU 132 receives instructions from the EEPROM or the RAM and controls read and write operations in both of these two memories. The EEPROM has two power supplies: a 12-volt power supply 110, and a 5-volt power supply 120. The 12-volt power supply supplies a voltage which is required for write operations in the EEPROM but is not required for read operations. The 5-volt supply is required for both kinds of operations.

The EEPROM is divided into two segments and in applicants' preferred embodiment these two segments each occupy one-half of the memory space of the EEPROM. The two segments 102 and 104 are shown in the diagram as A & B. The devices in the A segment can only be written into if the 12-volt power supply sent over lead 113 and controlled by switch 112 is active. Similarly, the devices in the B portion of the EEPROM can only be written into if the 12-volt power is applied over lead 115 controlled by switch 114. Normally, i.e. when the EEPROM is not being updated, switches 112 and 114 are both off. If one of the two halves of the EEPROM is being updated, then the corresponding switch is turned on to supply 12-volt power to the devices of the segment of the EEPROM. The 5-volt signal is always supplied over lead 122 to all the devices of the EEPROM. Since, in accordance with the principles of applicants' invention, the two sides of the EEPROM are never updated concurrently the two switches 112 and 114 are never both turned on. In applicants' preferred embodiment, the process to ensure that no more than one switch is performed in software. Clearly, many hardware arrangements are also known to those of ordinary skill in the art to ensure that the two switches are not operated simultaneously.

Figure 3:
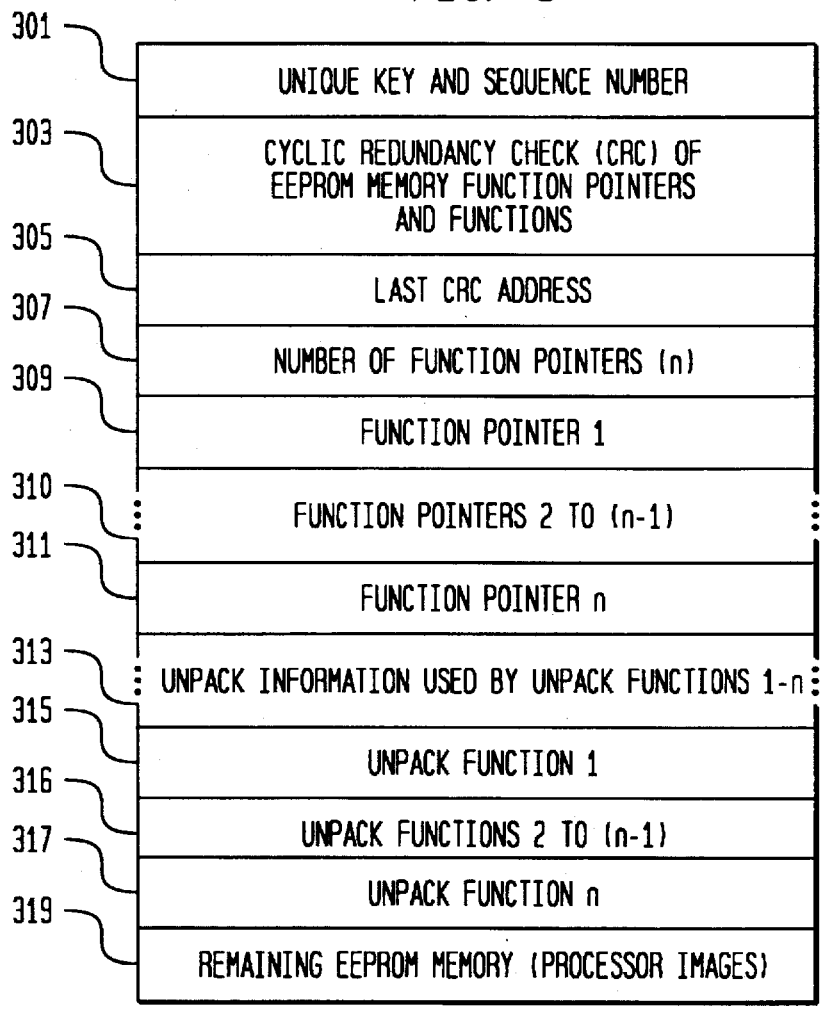

FIG. 3 illustrates the layout of the EEPROM memory. The first word 301 contains a unique key and sequence number representing, effectively, the issue number of the initialization. In case an off-line unit must be returned to active service because an on-line unit has failed, the contents of this key and sequence number are compared with the contents of the corresponding word in the other half of the EEPROM to see if the older initialization data should be used. If both halves of the EEPROM have a key plus a sequence number, this is an indication that an initialization of the newer version of the image in the EEPROM has been completed; therefore, the contents of the older EEPROM side should be ignored in favor of the contents of the newer version; the newer version is identified by the higher sequence number. The key is used to determine whether an accompanying sequence number is valid.

The next word 303 contains a cyclic redundancy check (CRC) code for that portion of the EEPROM which includes function pointers and unpack functions for controlling the initialization of the RAM. The third word 305 is the address of the last word covered by the CRC check of the second word. The fourth word 307 indicates the number of function pointers and functions stored in the first segment of the half of the memory. These four words are then followed by a series of function pointers (309, 310, 311) each of which function pointers points to one of the n unpack functions. Following the function pointers is unpack information used by unpack functions 1 to n. For example, the unpack information is used to locate the various segments of block 319. Unpack functions 1 through n are stored in blocks 315, 316, 317.

The second portion 319 of one segment (half) of the EEPROM contains text and data to be processed by the unpack functions and then stored in the RAM. The inactive RAM control programs and data support operations in the standby mode or the mode in which the RAM is being used for updating the EEPROM. This static data includes a table specifying the start and end of each of the segments of data; this table is pointed to by a pointer in the unpack function information 313.

In applicants' preferred embodiment there are four unpack functions. The first is the performance of a CRC check over all the blocks in segment 319 of the EEPROM memory. A CRC check sum is storm for every two kilobytes (2K) of this block of memory in a sixth segment of segment 319. The second unpack function is to copy data into the RAM.

The data consists of 6 blocks. The first block is the program text for the inactive RAM control program, a program in which the common control cycles when it is not performing update functions and from which it is released upon receipt of a signal from the switching modular processor. This program is also used for controlling the updating of the EEPROM from RAM, and supports diagnostic program execution. The second block is the static data required by the inactive RAM control program. The third block comprises the transfer vectors used by the program when under RAM control in order to find the location of the program text of the various update programs executed by the common control. The fourth block comprises the program text of those programs. The fifth block comprises all static data and includes the start and end address of each 2K of the static data when it is stored in the RAM. The sixth segment stores the CRC check sum for each 2 kilobyte block of RAM memory. When the copy program has been completed, the six segments of RAM have been initialized and the holes between these segments of RAM are used to store dynamic data in the RAM. Note that the initialization data is stored within a block of 960K bytes while the RAM has 2 megabytes of memory.

The third unpack function performs a CRC check on data copied into the RAM and compares this with information stored in the EEPROM sixth block as described above. The fourth unpack function turns control over to the RAM. All four unpack functions are called under the control of ROM; by turning over control to the RAM, the control by the ROM is terminated.

The inactive RAM control state is one wherein the common control cycles under the control of RAM and wherein the common control is either in intermediate pump state of in the stand-by state with the other common control controlling the system.

The EEPROM also contains additional data for use in initializing the RAM for subsequent initialization of the RAM of another (subtending) processor. The unpack information is used to locate this additional data. The initialized RAM contains a program for unpacking this additional data.

Figure 4:
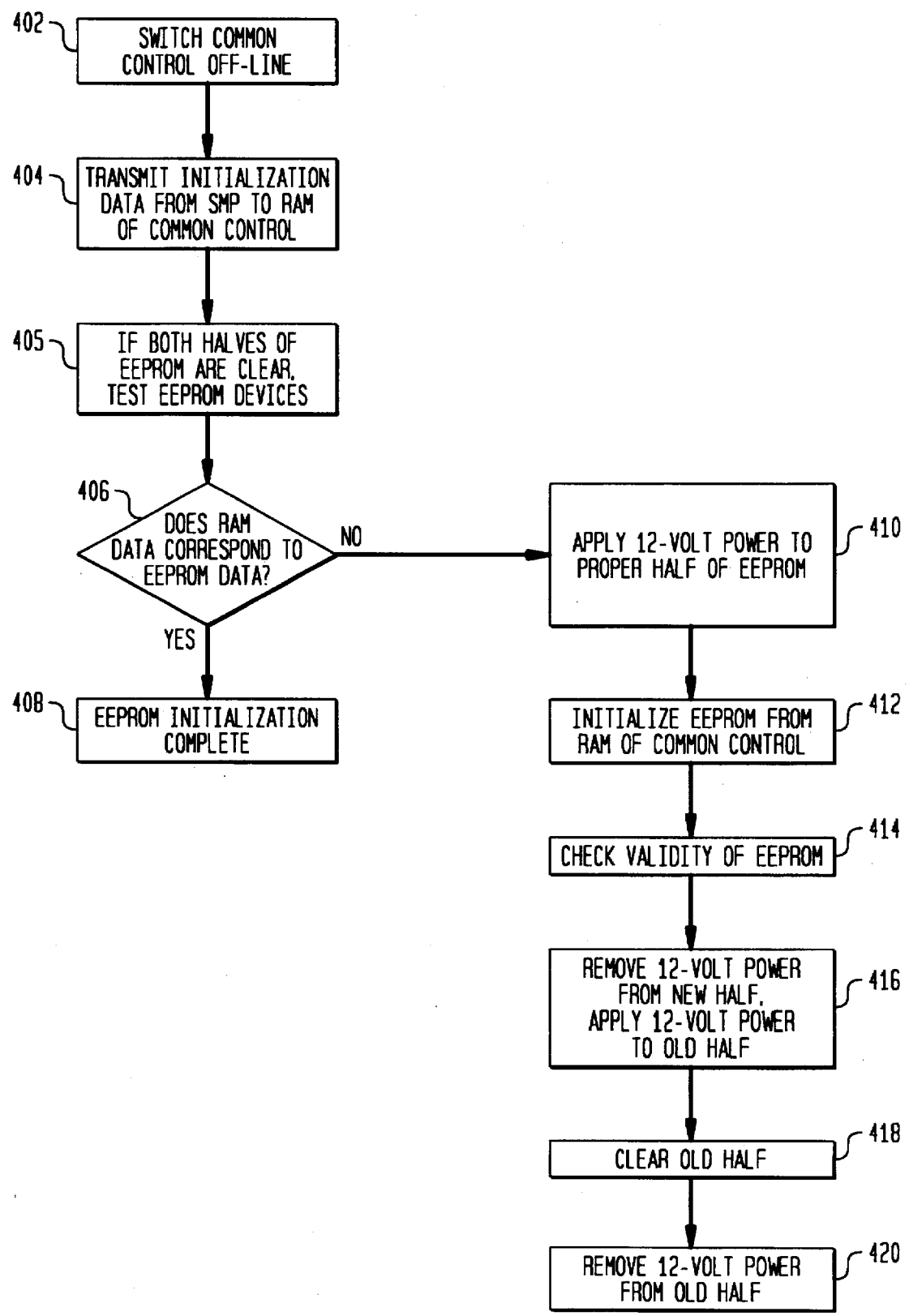

FIG. 4 illustrates the processes of updating one of the halves of the EEPROM. In response to a request to update such memory, one of the common controls is switched off-line (action block 402). Data for the initialization is then transmitted from the switch module processor (SMP) of the module to which the DNU/SONET interface and its common control is attached (action block 404). If all parts of both halves of the EEPROM are cleared (test 405), the EEPROM devices are tested and the process is continued. Action block 404 corresponds to line 7 of FIG. 1. Test 406 is then used to determine whether the contents of the RAM are equivalent to the contents of the uncleared half of the EEPROM. The test is performed by deriving data that would be written into an EEPROM for each of the locations of the EEPROM and checking whether the derived data is equal to the data already stored in the EEPROM. (The key and sequence number stored in location 301 are not used by the switch module processor as an indication of the issue number of an update, since any mistakes in generating such a number would lead to unnecessary EEPROM erase cycles.) If it is found that the contents of the RAM are equivalent to the contents of the EEPROM memory, then the action is complete (action block 408) and effectively it is not necessary to update the EEPROM. If the contents are not equivalent, then initialization of the cleared half of EEPROM begins. Twelve volt power is then applied to the new half (i.e., the half to be initialized) of the EEPROM (action block 410). The new half of the EEPROM is initialized (action block 412) and checked (action block 414). The key to the issue number is written last; a new issue number with a valid key is an indication that contents of the EEPROM half are valid. Thereafter, the old half of the EEPROM is cleared. First the 12-volt power is removed from the new portion of the EEPROM (action block 416) and the 12-volt power is applied to the old portion of the EEPROM (action block 416) in order to clear it (action block 418). Thereafter the 12-volt power is removed from that portion as well (action block 420).

As noted above, if the entire EEPROM is cleared, the EEPROM devices are tested. Normally, this happens only when the devices are initially received from the device manufacturer. At that time, a test is appropriate. Following such a test, at least one segment of the EEPROM is initialized. Therefore, a program check (test 405) is made to see if the device is totally cleared, and to test the devices only if that is the case. Test 405 can be part of the operating program, even in the factory, without causing undesirable extra device test cycles to be performed; thus, even the factory will automatically test EEPROM devices only if the EEPROM is totally cleared. Since the factory test program is advantageously a working program and not a specialized program, this function is also carried out in the field. In order to prevent the field from needlessly testing the EEPROM devices, the EEPROM is shipped in the factory initialized state, which contains a working program, not in the cleared state.

Figure 5:
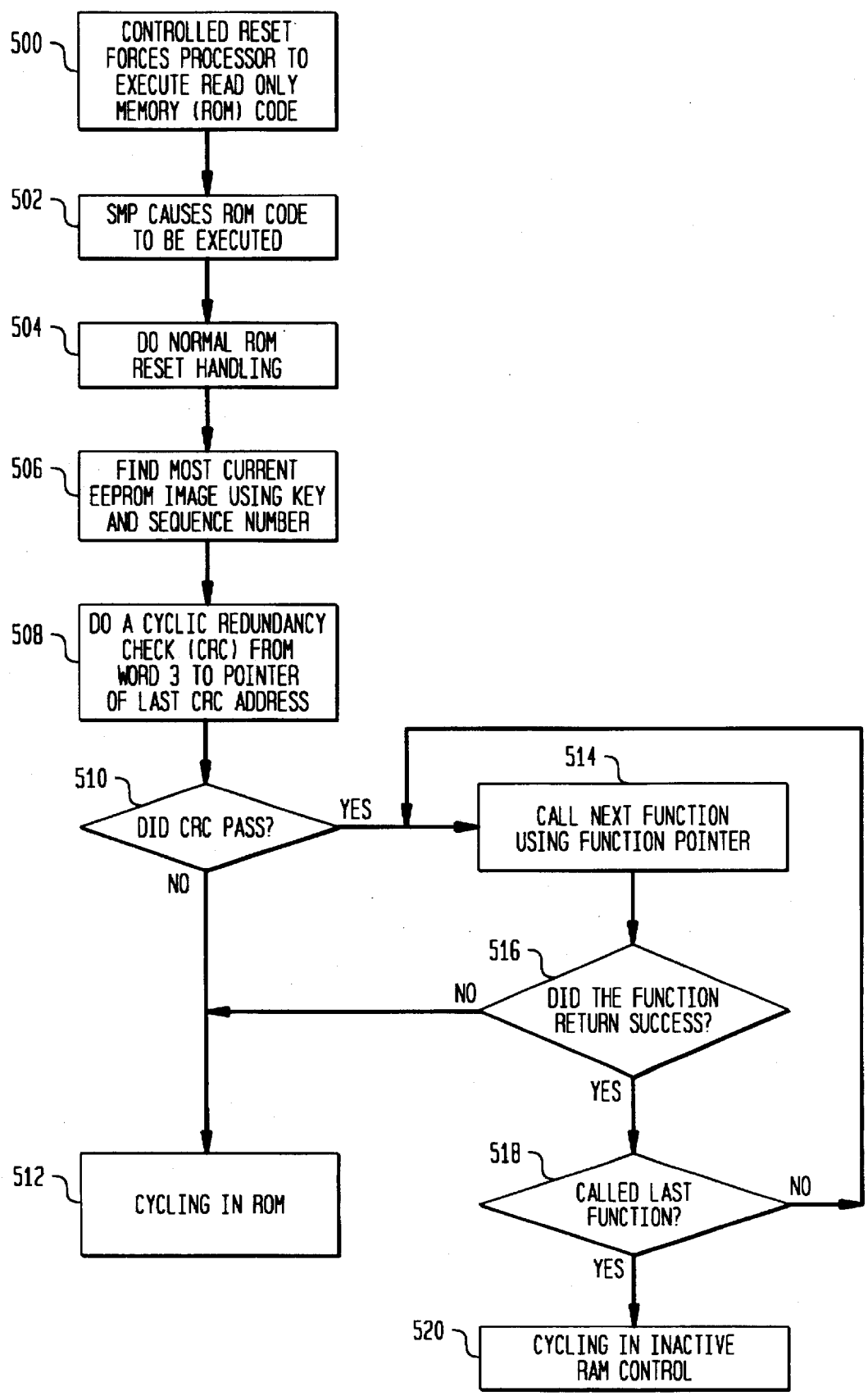

FIG. 5 illustrates the process of initializing the RAM from the EEPROM. The switch modular processor sends a signal to the common control to cause the common control to be reset (action block 502) which causes the common control to execute code stored in ROM (action block 504). Action block 506 is used to determine which half of the EEPROM is to be used for initializing. This is done by examining the first word, i.e., the word that contains the unique key and sequence number of each half of the EEPROM in order to determine whether either of these words is zero (indicating cleared memory), or if neither is zero, which sequence number and key represents the latest update. Since, following a successful update of one of the halves of the EEPROM, the other half is cleared, such a situation can only happen if the request to initialize RAM is received while an EEPROM half was being updated and the last step of the update had not been completed. Therefore, the half identified by the later (higher) sequence number accompanied by a valid key is the half that should be used for initializing the RAM.

Action block 508 indicates that a cyclic redundancy check is performed from the third word of the selected half of the EEPROM to the last CRC address (305) indicated by that third word. Test 510 is used to determine whether that CRC passed. If not, an indication that the common control is not available to become active, then the common control will continue cycling under the control of the ROM (action block 512). If the CRC passed, then the loop indicated by blocks 514, 516, and 518 is repeatedly executed. This loop consists of the ROM controlled program calling for the execution under EEPROM control of the next function using the function pointer stored in the EEPROM. (The first time block 514 is invoked, this will be the first function.) Test 516 determines if the function was executed successfully; if not, action block 512, previously described, is executed. If the function was successfully executed, then test 518 determines if this is the last function. If this is the last function, action block 520 (standby cycling under RAM control) is executed. The common control sends a signal to the switch module processor when it enters state 520, and a different signal when it enters state 512, so that the switch module processor knows whether the common control is available or not.

Many similar arrangements can be designed without departing from the scope of this invention. The invention is therefore limited only by the claims.

We claim:

1. A method of initializing a random access memory (RAM) from the contents of an electrically erasable programmable read only memory (EEPROM) comprising the steps of:

storing in the EEPROM data for initializing said RAM, said data comprising error check data for an initialized version of said RAM;

storing in said EEPROM a series of programs for controlling the initialization of said RAM;

initializing said RAM under the control of said series of programs; and checking that the initialized blocks of memory of said RAM have the same check sums as the check sums stored for the said RAM in said EEPROM.

2. The method of claim 1 wherein the process of storing said series of programs and said programs and data in said EEPROM comprises the steps of:

loading data for initializing said EEPROM into said RAM;

loading programs for controlling the initialization of said EEFPROM into said RAM; and loading data into said EEPROM under the control of said control program stored in said RAM.

3. A method of updating an electrically erasable programmable read only memory (EEPROM) from a source of updating data, said EEPROM requiring application of a special write control power supply to perform write operations, comprising the steps of:

switching a control unit off-line;

transmitting initialization data from said source to a random access memory (RAM) of said control unit;

testing whether said initialization data corresponds to data stored in one segment of said EEPROM;

if said initialization corresponds to data stored in said segment of said EEPROM, terminating the updating process; and if said initialization data does not correspond to data stored in said segment of said EEPROM, applying said special write control power supply to said EEPROM and performing the updating process.

4. A method of updating an electrically erasable programmable read only memory (EEPROM) from a source of updating data, said EEPROM requiring application of a special write control power supply to perform write operations, comprising the steps of:

switching a control unit off-line;

transmitting initialization data from said source to a random access memory (RAM) of said control unit;

applying said write control power supply to a segment of said EEPROM; and initializing said segment of said EEPROM using said initializing data.

5. The method of claim 4 further comprising the steps of:

testing whether said initialization data corresponds to data stored in another segment of said EEPROM;

if said initialization data corresponds to data stored in said another segment of said EEPROM, bypassing the applying and initializing steps;

if said initialization data does not correspond to data stored in said another segment of said EEPROM, performing the steps of applying said write control power supply and initializing said segment.

6. The method of claim 5 wherein the step of initializing said segment comprises the steps of:

initializing said segment of said EEPROM using said initialization data;

checking the initialized EEPROM data in said segment against check sums of said initialization data;

removing said write control power supply from said segment of said EEPROM; and initializing said RAM of said control unit from data of said segment of said EEPROM.

7. The method of claim 4 further comprising the steps of:

reading corresponding data from different segments of said EEPROM; and updating the one of said different segments whose data is blank.

8. The method of claim 7 further comprising the step of:

following said initialization, clearing EEPROM data from another segment.

9. The method of claim 7 wherein each initialized segment stores an identifying sequence number, further comprising the step of:

if none of said segments is blank, updating the segment having the oldest identifying sequence number.

* * * * *